(12) United States Patent
Zhuo et al.

(10) Patent No.: US 7,826,816 B2
(45) Date of Patent: Nov. 2, 2010

(54) SYSTEMS, METHODS, AND APPARATUS FOR FREQUENCY CONVERSION

(75) Inventors: Wei Zhuo, San Diego, CA (US);
Aristotele Hadjichristos, San Diego, CA (US); Gurkanwal S. Sahota, San Diego, CA (US); Solti Peng, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 544 days.

(21) Appl. No.: 11/531,314

(22) Filed: Sep. 13, 2006

(65) Prior Publication Data

US 2008/0014896 A1 Jan. 17, 2008

Related U.S. Application Data

(60) Provisional application No. 60/830,198, filed on Jul. 11, 2006.

(51) Int. Cl.
*H04B 1/26* (2006.01)

(52) U.S. Cl. ...................... 455/315; 455/324

(58) Field of Classification Search ............... 455/313, 455/314, 315, 318, 323, 324, 333, 334, 283, 455/292, 293
See application file for complete search history.

(56) References Cited

U.S. PATENT DOCUMENTS 5,945,857 A 8/1999 Havens .................. 327/175
6,198,347 B1 3/2001 Sander .................. 330/251
6,891,420 B2 5/2005 Martin .................. 327/260
6,933,766 B2 8/2005 Khlat .................... 327/359
2002/0181619 A1 12/2002 McCune ................ 375/324
2002/0183033 A1 12/2002 Gu ........................ 455/302
2005/0215215 A1 9/2005 Shemesh ............... 455/209
2005/0226349 A1 10/2005 Manku .................. 375/316
2005/0239430 A1* 10/2005 Shah ..................... 455/326
2006/0199562 A1* 9/2006 Taylor ................... 455/333
2007/0105522 A1* 5/2007 Muhammad et al. ... 455/326
2007/0126500 A1* 6/2007 Mattisson et al. ...... 330/10

FOREIGN PATENT DOCUMENTS

| DE | 102004059117 | 6/2009 |
|---|---|---|
| EP | 0276130 A2 | 7/1988 |
| EP | 1615336 | 1/2006 |
| WO | WO2006002945 | 1/2006 |

OTHER PUBLICATIONS

Christensen, C. A low power, low data rate integrated 433 MHz RF transceiver in CMOS. 2003 IEEE UGIM Symp. Digest, Boise, ID, Jul. 2003, pp. 70-73.

(Continued)

*Primary Examiner*—Nguyen Vo
(74) *Attorney, Agent, or Firm*—Jiayu Xu

(57) ABSTRACT

A method according to one embodiment includes using a quadrature set of local oscillator signals having duty cycles of substantially less than fifty percent to perform a mixing operation on a radio-frequency current signal. Other embodiments include using a quadrature set of local oscillator signals having duty cycles of less than twenty-five percent.

29 Claims, 17 Drawing Sheets

OTHER PUBLICATIONS

Goldfarb, M. et al. Even harmonic double-balanced active mixer for use in direct conversion receivers. IEEE J. Solid-State Circ., v.38 n. 10, Oct. 2003, pp. 1762-1766.

Petrov, A. System approach for low1/f noise, high IP2 dynamic range CMOS mixer design. Proc. 15$^{th}$ Biennial IEEE UGI Microelectronics Symp., 2003, pp. 74-77.

Gudem, P. and Larson, L. ECE265B, Mixer, Part 1, UCSD. Last accessed Jun. 30, 2006 at http://ece-classweb.ucsd.edu:16080/winter06/ece265b/ECE265BMixer_Part_1.pdf. 54 pp.

Steyart M S J et al: Low-Voltage Low-Power CMOS-RF Transceiver Design IEEE Transactions on Microwave Theory and Techniques, IEEE Service Center, Piscataway, NJ, US, vol. 50, No. 1, Part 2, Jan. 2002, pp. 281-287, XP001085550.

International Preliminary Report on Patentability—PCT/US07/073129—The International Bureau of WIPO, Geneva Switzerland—Jan. 13, 2009.

Beffa, F. et al., "A 6-5-MW Receiver Front-End for Bluetooth in 0.18-muM CMOS" IEE MTT-S International Microwave Symposium Digest. (IMS 2002). Seattle, WA, Jun. 2-7, 2002, IEE MTT-S International Microwave Symposium, New York NY: IEEE, US, vol. International Search Report & Written Opinion - PCT/US07/73129, International Search Authority - European Patent Office - Jan. 7, 2008.

* cited by examiner

US 7,826,816 B2

SYSTEMS, METHODS, AND APPARATUS FOR FREQUENCY CONVERSION

CLAIM OF PRIORITY UNDER 35 U.S.C. §119

The present Application for Patent claims priority to Provisional Application No. 60/830,198 entitled "Using non-overlap clock in quadrature mixer to improve noise and gain" filed Jul. 11, 2006, and assigned to the assignee hereof and hereby expressly incorporated by reference herein.

FIELD OF THE INVENTION

This invention relates to wireless communications.

BACKGROUND

Many techniques for transferring information from one location to another include one or more frequency conversion operations. In a transmitting application, for example, a signal carrying information may be upconverted into a radio-frequency (RF) signal for transmission over a medium such as a wireless channel or a conductive or optical cable. In a receiving application, an RF signal carrying information may be received from such a medium and downconverted to an intermediate frequency or to baseband for processing and/or demodulation.

Mixers are commonly used to perform frequency conversion operations. In a typical application, a mixer is arranged to multiply a signal at an initial frequency F0 by a local oscillator (LO) signal to obtain components at the sum and difference frequencies. For example, a quadrature mixing operation may be used to obtain two channels that are 90 degrees out of phase according to an expression such as the following:

$$\cos(\omega_{F0}t)\cos(\omega_{LO}t) = \frac{1}{2}(\cos[(\omega_{F0} + \omega_{LO})t] + \cos[(\omega_{F0} - \omega_{LO})t]),$$

$$\cos(\omega_{F0}t)\sin(\omega_{LO}t) = \frac{1}{2}(\sin[(\omega_{F0} + \omega_{LO})t] - \sin[(\omega_{F0} - \omega_{LO})t]).$$

The desired one of the two resulting frequency components in each channel may be selected by bandpass filtering the mixer output if necessary.

In a heterodyne circuit, the intermediate frequency (IF) is significantly different from both baseband and RF, such that the conversion between baseband and RF is typically performed in two or more stages. In a homodyne or "zero-IF" circuit, the frequency of the LO signal is substantially equal to the RF, such that the signal is converted between baseband and RF in one stage. In other techniques that are termed "low-IF" or "near-zero-IF", the IF is close to baseband (e.g., a few hundred kHz or less).

SUMMARY

An apparatus according to one embodiment includes a frequency converter that has a signal generator configured to generate a first complementary pair of local oscillator (LO) signals and a second complementary pair of LO signals such that a phase difference between a signal of the first complementary pair and a signal of the second complementary pair is substantially equal to ninety degrees. The frequency converter also has a first mixer configured and arranged to mix a radio-frequency (RF) current signal with the first complementary pair of LO signals, and a second mixer configured and arranged to mix the RF current signal with the second complementary pair of LO signals. In this apparatus, the signal generator is configured to generate each signal of the first and second complementary pairs to have a duty cycle of substantially less than fifty percent.

A method of frequency conversion according to an embodiment includes generating a first complementary pair of local oscillator (LO) signals and a second complementary pair of LO signals such that a phase difference between a signal of the first complementary pair and a signal of the second complementary pair is substantially equal to ninety degrees. The method also includes mixing, in a first channel, a radio-frequency (RF) current signal with the first complementary pair of LO signals, and mixing, in a second channel, the RF current signal with the second complementary pair of LO signals. In this method, each signal of the first and second complementary pairs has a duty cycle of substantially less than fifty percent.

An apparatus according to another embodiment includes a frequency converter having means for generating a first complementary pair of local oscillator (LO) signals and a second complementary pair of LO signals such that a phase difference between a signal of the first complementary pair and a signal of the second complementary pair is substantially equal to ninety degrees. The frequency converter also includes means for mixing, in a first channel, a radio-frequency (RF) current signal with the first complementary pair of LO signals, and means for mixing, in a second channel, the RF current signal with the second complementary pair of LO signals. In this apparatus, the means for generating is configured to generate each signal of the first and second complementary pairs to have a duty cycle of substantially less than fifty percent.

BRIEF DESCRIPTION OF THE DRAWINGS

FIG. 3b shows another schematic diagram of the passive mixer illustrated in FIG. 3a.

DETAILED DESCRIPTION

It is generally desirable to perform frequency conversion such that the conversion gain is maximized and/or the level of noise in the converted signal is minimized.

The term "node" is used herein to include its ordinary meaning of "a region of a circuit where there is no change in potential." The term "terminal" is used herein to include its ordinary meaning of a "terminal node" of a circuit, device, or element.

Although for convenience the following description refers principally to applications and devices configured for signal reception, the structures and methods disclosed may also be applied to applications and devices configured for signal transmission, and such application is expressly contemplated and hereby disclosed.

Although the convention of labeling the opposite ends of a mixer as "RF" and "IF" is followed herein, use of the frequency converters and other structures disclosed herein for direct conversion or "zero-IF" applications (i.e., direct conversion between RF and baseband) is expressly contemplated and hereby disclosed. Therefore, it should be understood that the label "IF" as used herein simply indicates a signal at a frequency that is a difference between the RF and LO frequencies, which may be substantially equal to zero (i.e., a baseband signal).

Figure 1A:
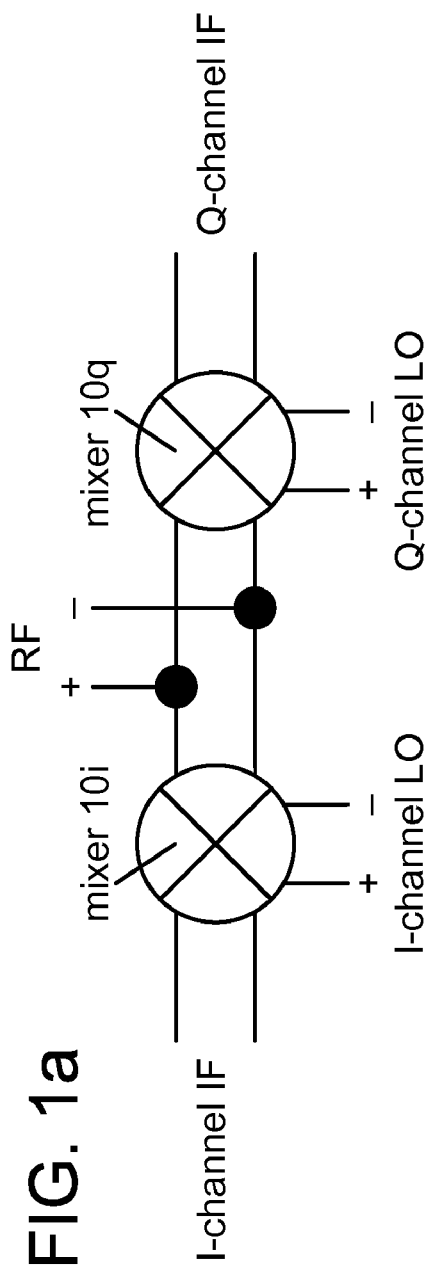
FIG. 1a shows a block diagram of a frequency converter including two mixers.

FIG. 1a shows a block diagram of a frequency converter based on a quadrature mixer architecture that includes two mixers 10i,q, each coupled to a differential RF input and outputting a respective one of a quadrature pair of IF signals. Mixers may be implemented in various ways. For example, some implementations use transmission line structures, passive components (resistors, capacitors, and/or inductors), and/or diodes. Most mixers, however, are implemented with active devices such as bipolar junction transistors (BJTs) or metal-oxide-semiconductor field-effect transistors (MOSFETs), which may be fabricated to have desirable qualities such as low cost, small feature size, and good reproducibility. A MOSFET includes a gate configured to control current flow across a channel region, which is proximate to and insulated from the gate and has two ends (called "drain" and "source"), one at either side of the gate.

At the present time, mixers are typically implemented as switching mixers. A switching mixer is configured to multiply the RF signal by a sequence that alternates, according to a local oscillator frequency and phase, between two values having substantially equal amplitude and opposite magnitude (e.g., +1 and −1). Such mixers are implemented using devices such as BJTs or MOSFETs that are arranged to switch the two sides of the RF signal between the mixer output terminals.

Figure 1B:
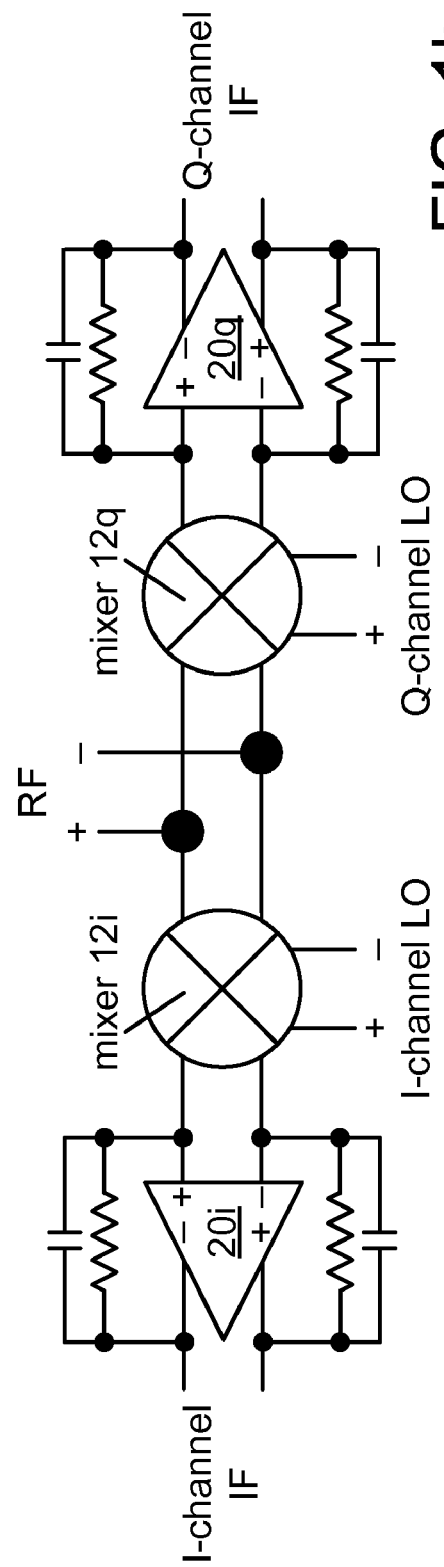
FIG. 1b shows a block diagram of a frequency converter driving transimpedance amplifiers.

A switching mixer architecture may be configured to switch an RF voltage (a "voltage-commutating" architecture) or an RF current (a "current-commutating" architecture). FIG. 1b shows a block diagram of a frequency converter based on a current-commutating quadrature mixer architecture. In this example, the outputs of the switching mixers 12i,q drive respective transimpedance amplifiers 20i,q, implemented here as differential operational amplifiers with feedback, which convert the current signals into voltage signals.

Figures 2A, 2B:
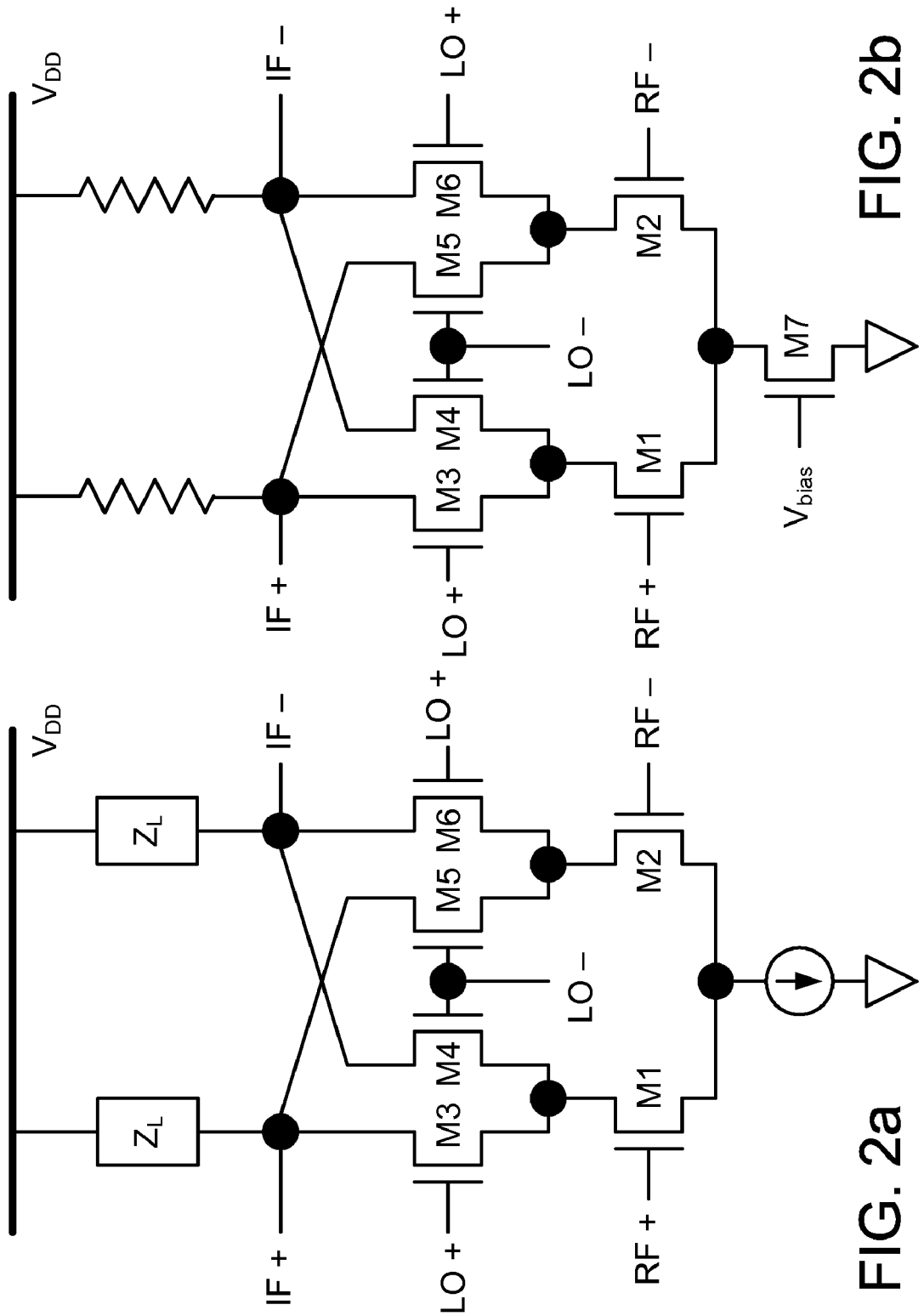
FIG. 2a shows a schematic diagram of an implementation of an active mixer.
FIG. 2b shows a schematic diagram of another implementation of an active mixer.

A switching mixer may be implemented according to an active configuration or a passive configuration. FIG. 2a shows a schematic diagram of one example of a double-balanced active current-commutating mixer circuit, also known as a Gilbert cell. This circuit includes a differential transconductance stage (M1, M2) and a quadrature mixer core (M3-M6). The mixer core includes two differential pairs (M3, M4 and M5, M6) and operates as a fully balanced, phase-reversing current switch. The gates of the mixer core switches are arranged to be driven by a pair of local oscillator (LO) signals LO+, LO− that are complementary (that is to say, 180 degrees out of phase). It is typically desirable for each LO signal to have a duty cycle that is substantially close to 50% (for example, to avoid even-order harmonics).

As shown in FIG. 2b, the current source that provides the bias current to be switched (or "steered") may be implemented as an active device M7. Alternatively, the current source may be implemented as an inductor or LC circuit (e.g., a parallel LC tank resonating at the RF frequency). In another example, the sources of devices M1, M2 are connected directly to the $V_{SS}$ rail rather than through a current source. It is also possible for two mixer cores (e.g., one in the I channel and one in the Q channel) to share a common transconductance stage. The matched loads $Z_L$ may be implemented as resistors as shown in FIG. 2b. Alternatively, the matched loads may be implemented as or including other passive components, such as inductors, or as active loads.

One potential disadvantage of active mixers is 1/f noise, commonly called "flicker noise." The action of switching the RF signal from one switch of a differential pair of a switching mixer to the other does not occur instantaneously, and active mixers generate flicker noise when both switches in a differential pair are on (i.e., the channels of both devices are conducting). This period is called the "crossover point," and it may occur especially at high frequencies when the waveform of the local oscillator becomes rounded rather than square. This flicker noise is visible at the mixer output and is generally proportional to the level of the DC bias current in the switching devices.

Flicker noise has a power spectral density that is inversely proportional to frequency. In a heterodyne architecture, the mixer output frequency is typically far above the range of frequencies in which flicker noise is significant. Because flicker noise dominates at low frequencies, however, it may become a significant problem with homodyne ("zero-IF" or "direct conversion") and low-IF architectures. Flicker noise of the mixer switches is generally the dominant contributor to front-end flicker noise.

Figure 3B:
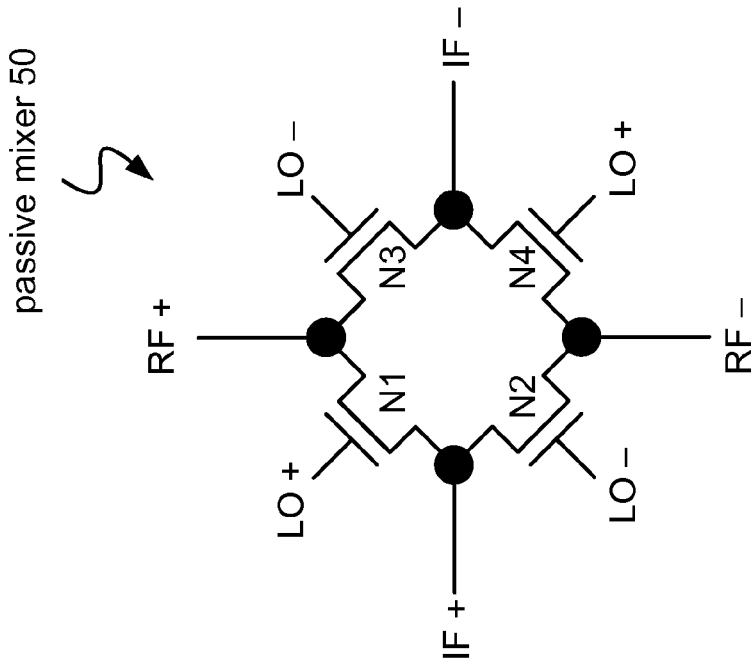
Figure 3A:
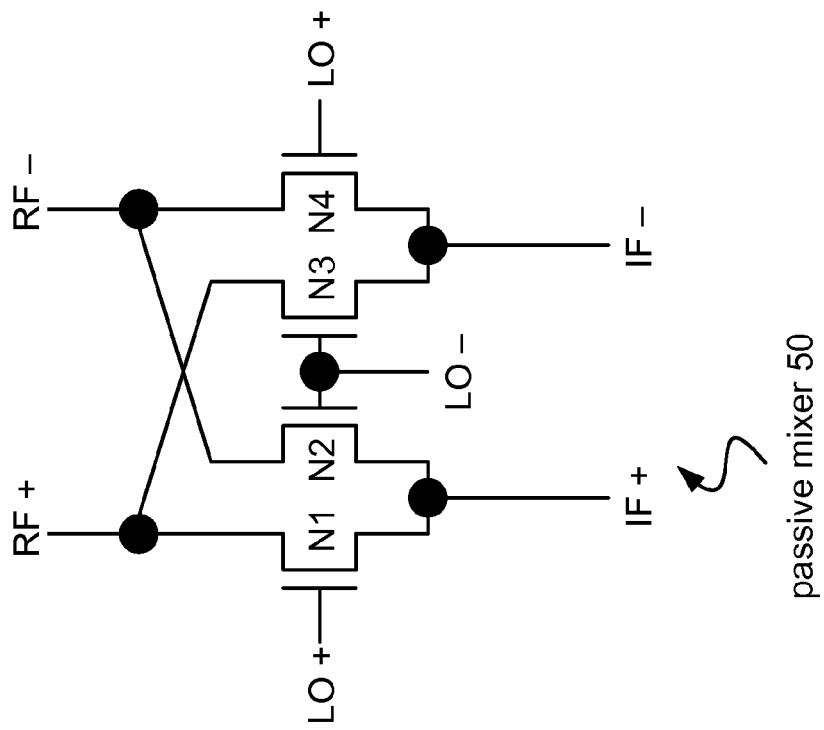
FIG. 3a shows a schematic diagram of a passive mixer.

Flicker noise generation in the mixer may be greatly reduced by using a passive mixer rather than an active one. FIG. 3a shows a schematic diagram of a passive mixer that includes four MOSFET switches N1-N4. FIG. 3b shows another diagram of the same circuit that shows its ring structure. Because the channels of the switches of a passive mixer carry substantially no DC current, flicker noise generation by the switches may be largely eliminated, and this feature is a principal advantage of passive mixers in applications that are sensitive to 1/f noise.

The size of the switches in a switching mixer may be optimized according to a desired tradeoff between linearity and matching on one hand, and noise and driving requirements on the other hand. A larger switch will tend to have a lower on-resistance, which improves linearity and matching, but a bigger parasitic capacitance, which increases noise and driving requirements. In one example, the switches N1-N4 of an implementation of a passive mixer are configured to have a W/L ratio in the range of about 300-400 (three hundred to four hundred).

As noted above, passive mixers operate with substantially no bias current and thus typically consume less power and generate much less flicker noise than active mixers. However, passive mixers also have a conversion gain of less than unity (i.e., a conversion loss) such that the output of a passive mixer usually must be amplified. Typically a passive mixer is followed by an amplification stage that may include an operational amplifier (or "opamp"). Unfortunately, opamps contribute both flicker and white noise, with flicker noise dominating at low frequencies (e.g., less than a few MHz for CMOS designs). It is desirable to minimize the level of the noise contribution by the amplification stage.

Figure 4:
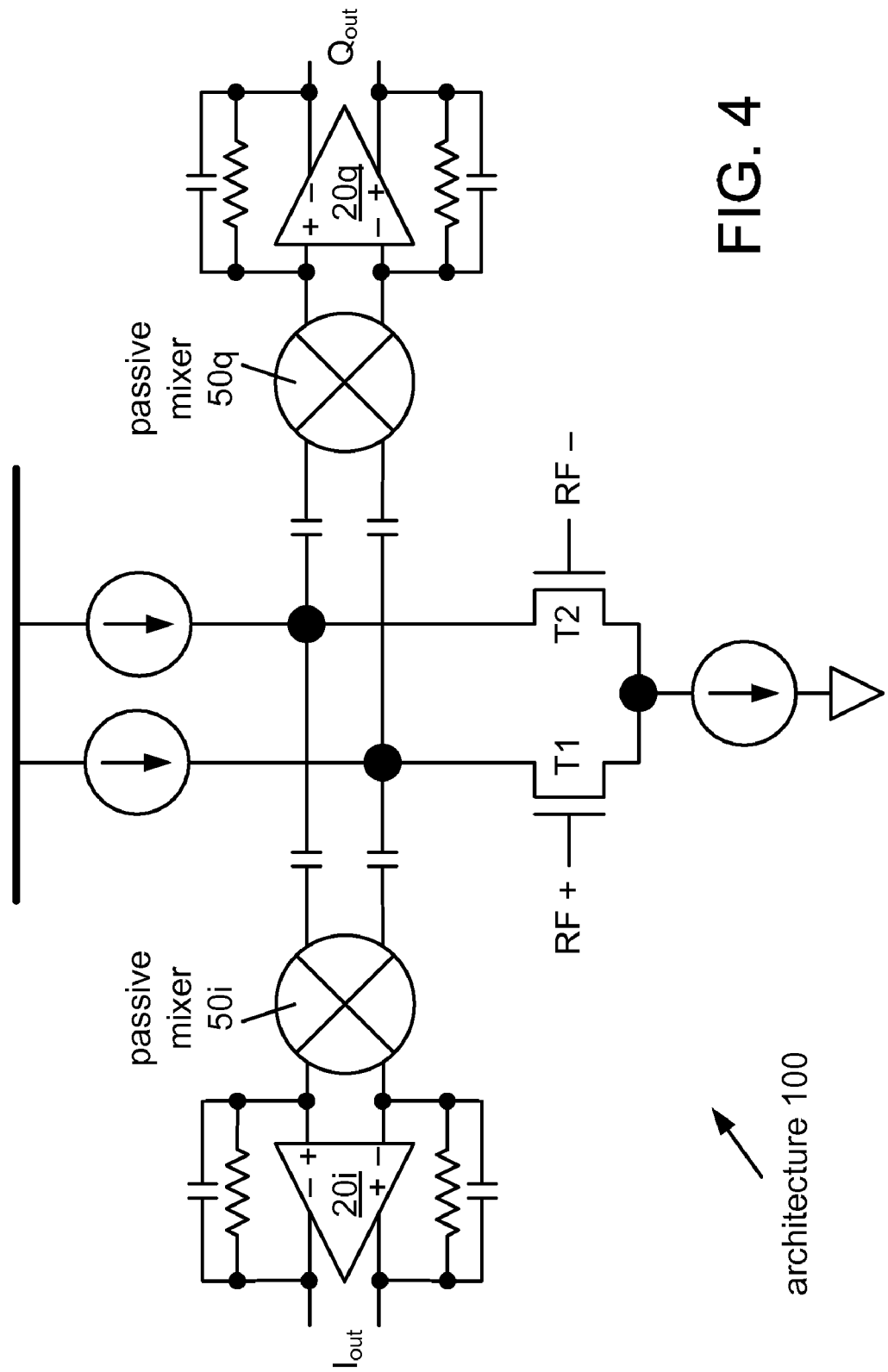
FIG. 4 shows a block diagram of a frequency converter 100 based on a passive current-commutating mixer architecture.

A passive mixer 50 as shown in FIG. 3a,b may be used as a voltage-commutating mixer or as a current-commutating mixer. FIG. 4 shows an example of a frequency converter 100 based on a current-commutating quadrature mixer architecture that includes two instances 50i,q of passive mixer 50. Frequency converter 100 has a transconductance stage (including devices T1, T2) that converts the RF voltage signal into a current signal and is AC coupled to the mixers. In another example, the sources of devices T1, T2 are connected directly to the $V_{SS}$ rail rather than through a current source. The local oscillator signals (not shown) may also be AC coupled (capacitively coupled) to the respective mixer switch gates. Each mixer drives a low-impedance load, which in this example is the virtual ground of a respective closed-loop opamp 20i,q. In some cases, each passive mixer 50i,q also has a small capacitor connected across its output terminals (e.g., to remove high-frequency components).

Figure 5:
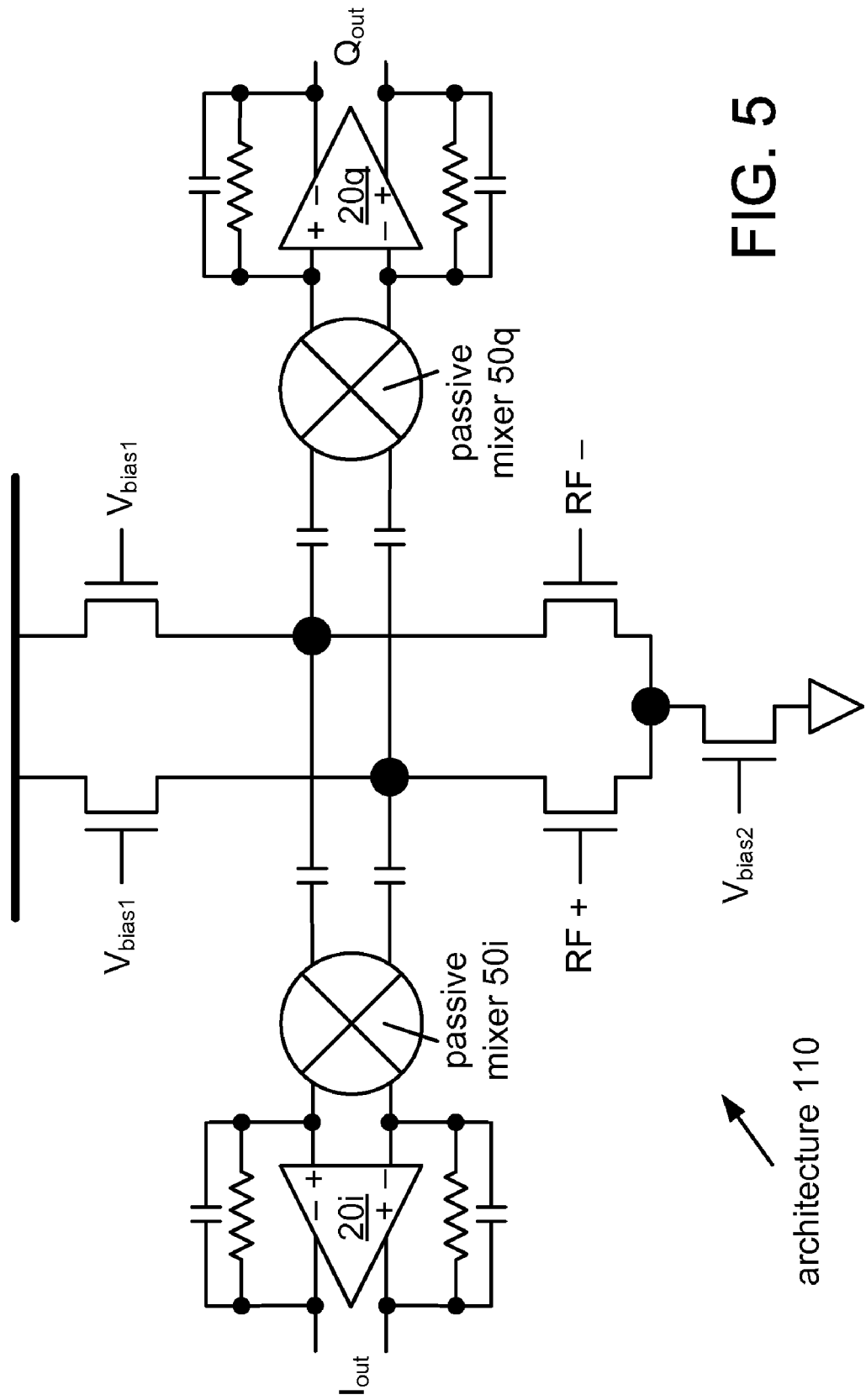
FIG. 5 shows a block diagram of an example 110 of frequency converter 100.
Figure 6B:
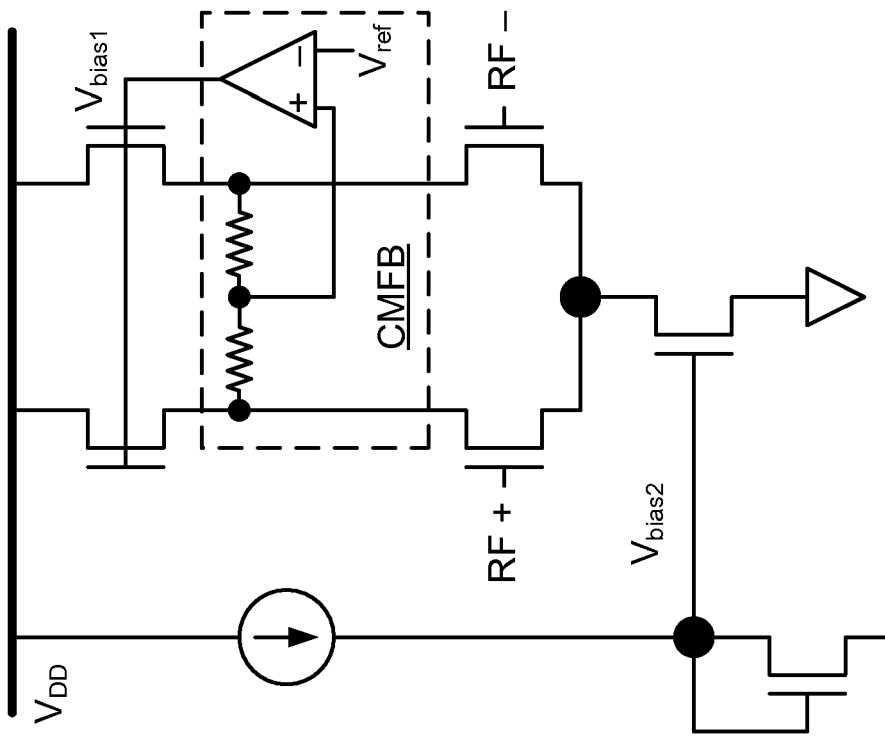
FIG. 6b shows a schematic diagram of another example of a biasing arrangement.
Figure 6A:
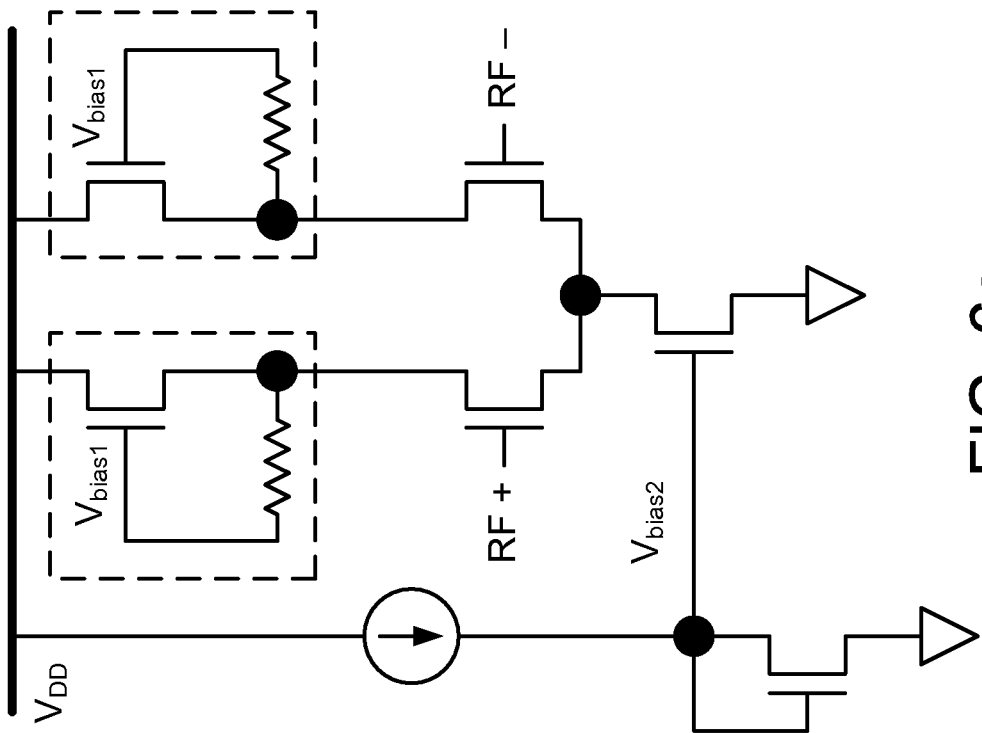
FIG. 6a shows a schematic diagram of an example of a biasing arrangement.

FIG. 5 shows an example 110 of frequency converter 100 in which MOSFETs are used to implement the current sources. The gate bias voltages for these devices may be generated by various techniques. FIG. 6a shows one example in which the devices that serve as active loads for devices T1, T2 are self-biased. In this particular example, each of the active load devices is diode-connected via a resistive path between its gate and source. FIG. 6b shows another biasing example in which a common-mode feedback (CMFB) circuit is used to bias the active load devices. Other forms of CMFB circuits may also be used in such an arrangement. Whether the active load devices are self-biased or biased using a CMFB circuit, a current mirror may be used to set the DC operation point of an active device that provides the DC current to the transconductance devices T1, T2, as shown in FIGS. 6a and 6b. Alternatively, another form of bias voltage generating circuit may be used to generate one or more of the gate bias voltages, such as a bandgap reference voltage generator or a PTAT (proportional to absolute temperature) biasing circuit.

Figure 7:
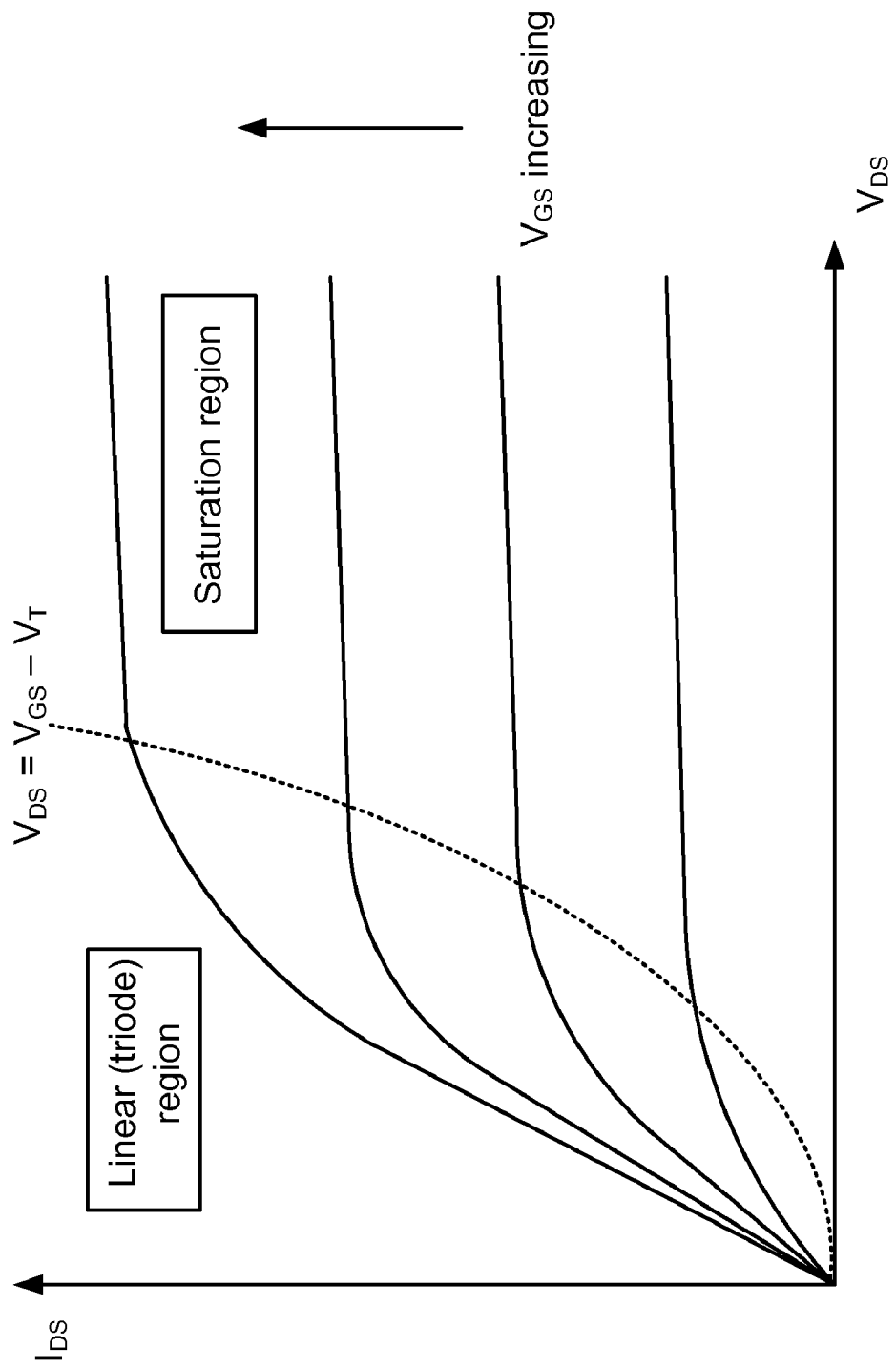
FIG. 7 shows an example of a MOSFET characteristic curve.

FIG. 7 shows an example of a MOSFET characteristic curve, where IDS denotes current between drain and source (i.e., the most positive end and the most negative end, respectively, of the channel regions of an n-channel MOSFET), $V_{DS}$ denotes voltage between drain and source, $V_{GS}$ denotes voltage between gate and source, and $V_T$ denotes the threshold voltage of the device. As may be appreciated from this figure, the impedance of a MOSFET ($dV_{DS}/dI_{DS}$) depends upon the region in which the device is operated. The switches of an active mixer are typically biased to operate in the saturation region, resulting in a high impedance. The switches N1-N4 of a passive mixer are biased near the threshold to operate in the linear (or "triode") region and thus have a low impedance.

Figure 8:
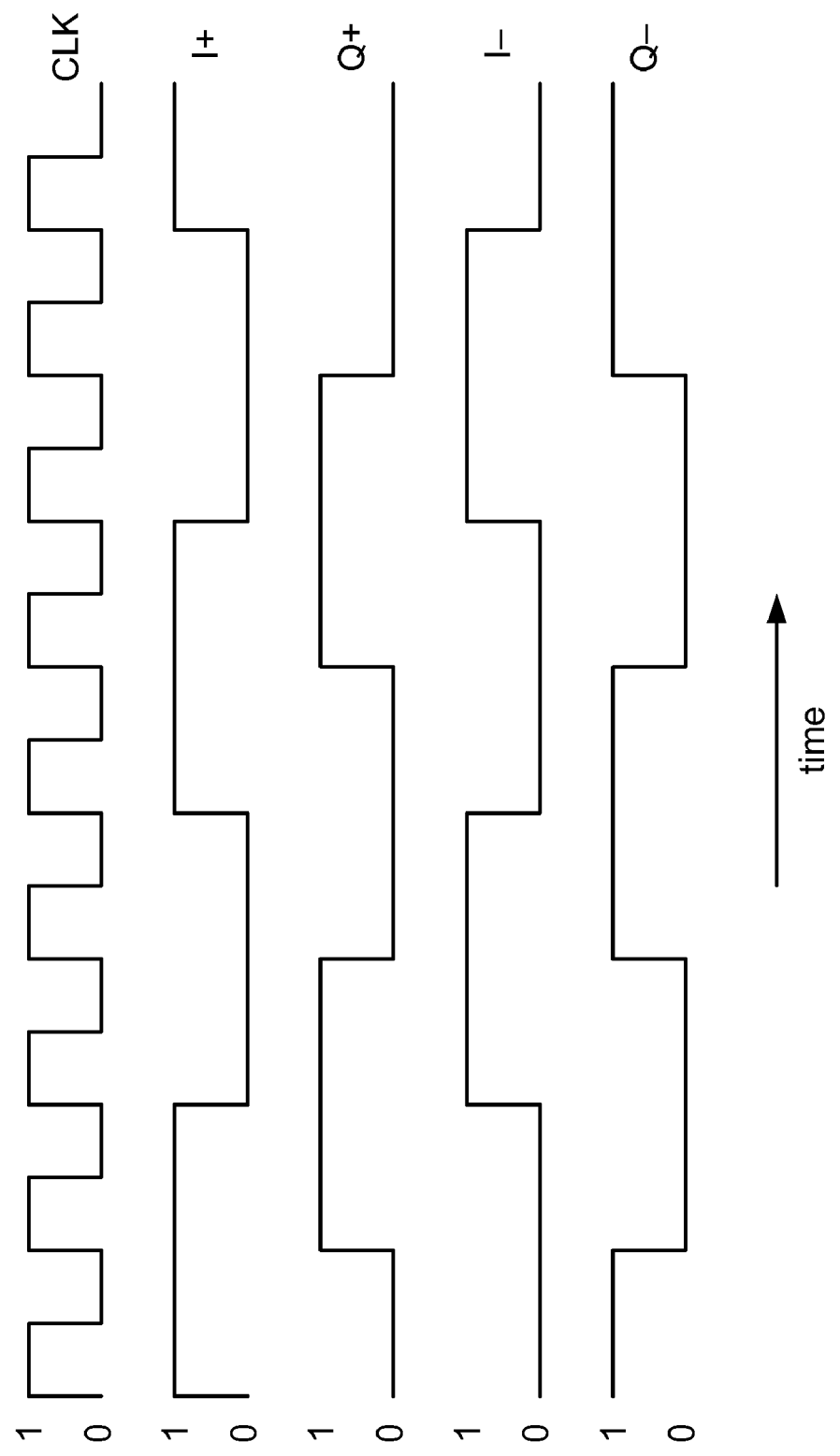
FIG. 8 shows a diagram of a quadrature set of local oscillator signals having duty cycles of 50%.

As noted above, the gates of a switching mixer are typically driven by a pair of complementary LO signals. FIG. 8 shows a diagram of a typical set of quadrature local oscillator signals for driving the mixers of a quadrature mixer architecture. The I+ and Q+ signals are 90 degrees out of phase, and each one has a complement (I−, Q−) that is 180 degrees out of phase. In this example, each of the four LO signals has an amplitude that alternates between 0 and 1 at the local oscillator frequency and according to the phase of the particular signal. The local oscillator signals are typically generated to have a duty cycle substantially close to 50%, which reduces even-order harmonics.

Figure 9:
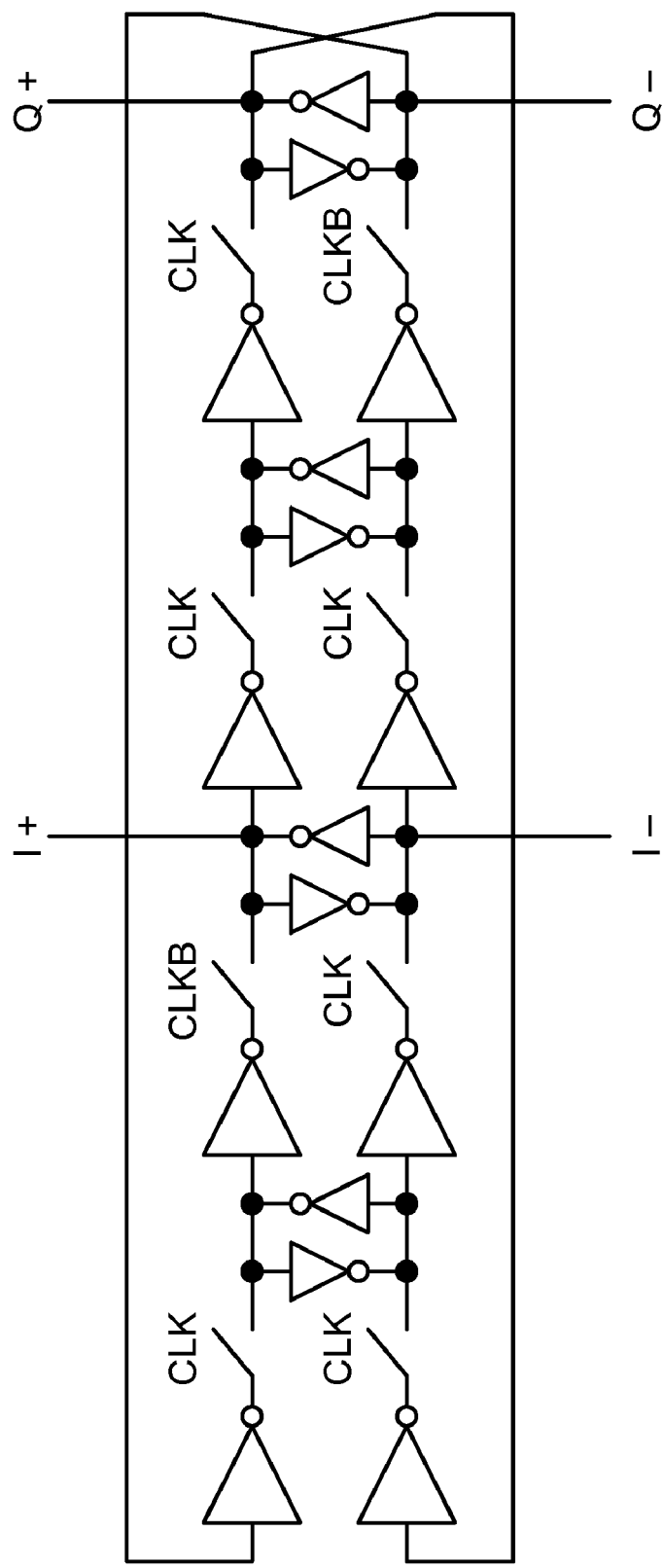
FIG. 9 shows a block diagram of a divide-by-4 counter.

FIG. 9 shows one example of a divide-by-four circuit that may be used to generate a set of quadrature local oscillator signals as shown in FIG. 8. This divider takes a differential clock input (a clock signal CLK as shown in FIG. 8 and its complement CLKB) and generates a rail-to-rail differential output for both I and Q channels. As shown in FIG. 4, the divider includes latches that are smaller than the inverters (e.g., four times smaller) and are arranged between the differential paths, which may help to maintain fast signal switching and good differential balance. Divide-by-four circuits including D flip-flops or differential inverters are also known.

Figure 10:
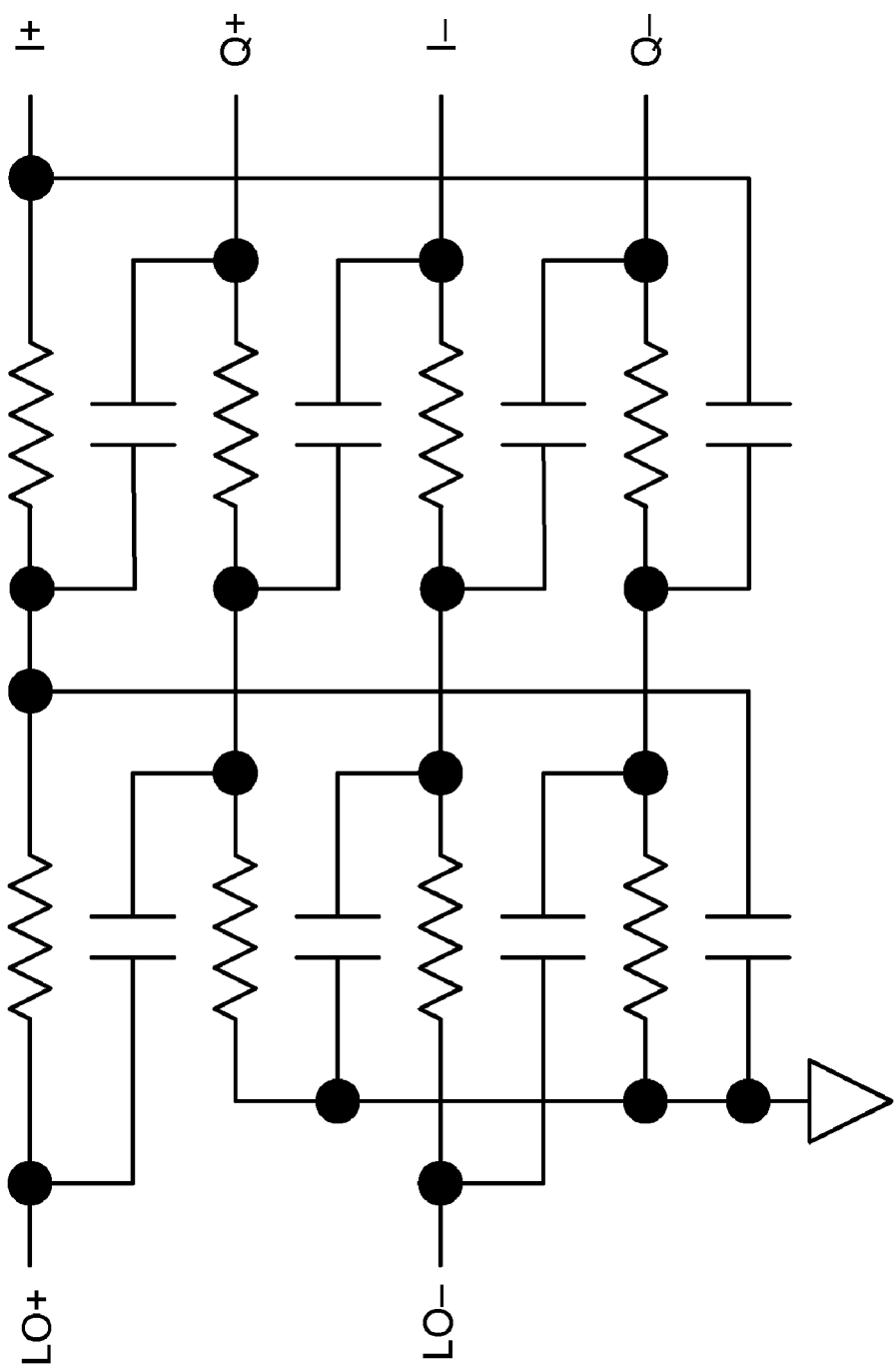
FIG. 10 shows a schematic diagram of a polyphase filter.

In some cases, implementing an oscillator to generate a clock signal running at four times the LO frequency may not be feasible (e.g., in very high frequency or very low power applications) or may otherwise be undesirable. In such cases, another structure such as a polyphase filter or other phase-shift network may be used to generate the set of quadrature LO signals. FIG. 10 shows one example of a second-order polyphase filter configured to generate a set of quadrature local oscillator signals as shown in FIG. 8. Examples of other structures that may be used to generate the quadrature LO signals include transmission line structures and opamp-based all-pass networks.

Figure 11:
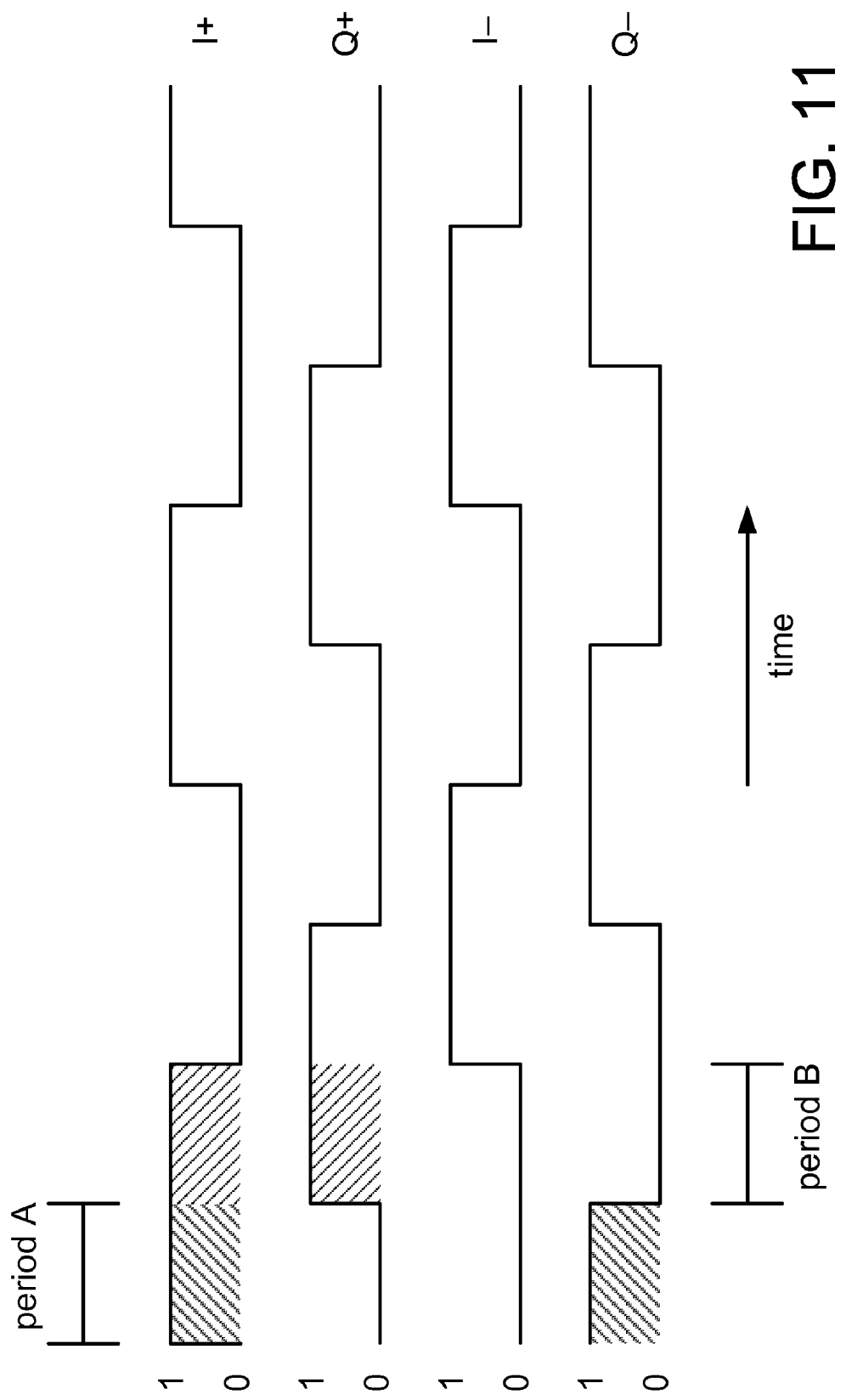
FIG. 11 shows an example of overlap between on-cycles in the set of local oscillator signals of FIG. 8.

The low impedance of the switches in a passive mixer may lead to several problems in practice. For example, poor isolation between the I and Q channels is one significant problem that may arise with the use of passive mixers in a quadrature frequency converter. As shown in FIG. 8, for example, LO signals having duty cycles of about 50% are commonly used to drive a quadrature pair of switching mixers. One may appreciate from this figure that at any moment, one of the signals I+ and I− is high, and one of the signals Q+ and Q− is high. FIG. 11 illustrates an example of two periods of overlap during an active half-cycle of the signal I+. While the particular pair of active signals changes every quarter-cycle, as a consequence of this overlap, at any moment a switch is on in both of the I and Q mixers.

Figure 12:
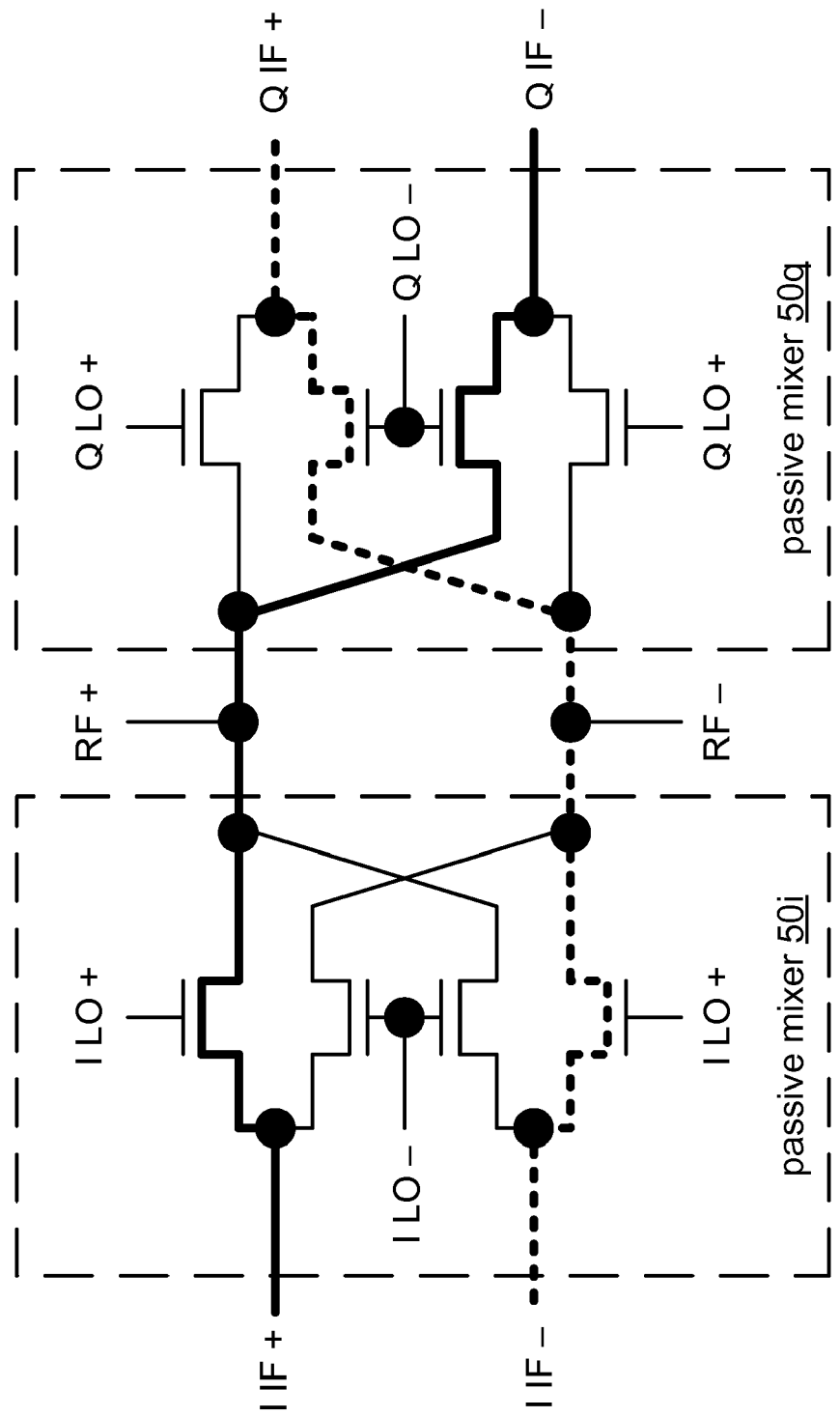
FIG. 12 shows an example of a cross-channel circuit path resulting from the overlap shown in period A of FIG. 11.
Figure 13:
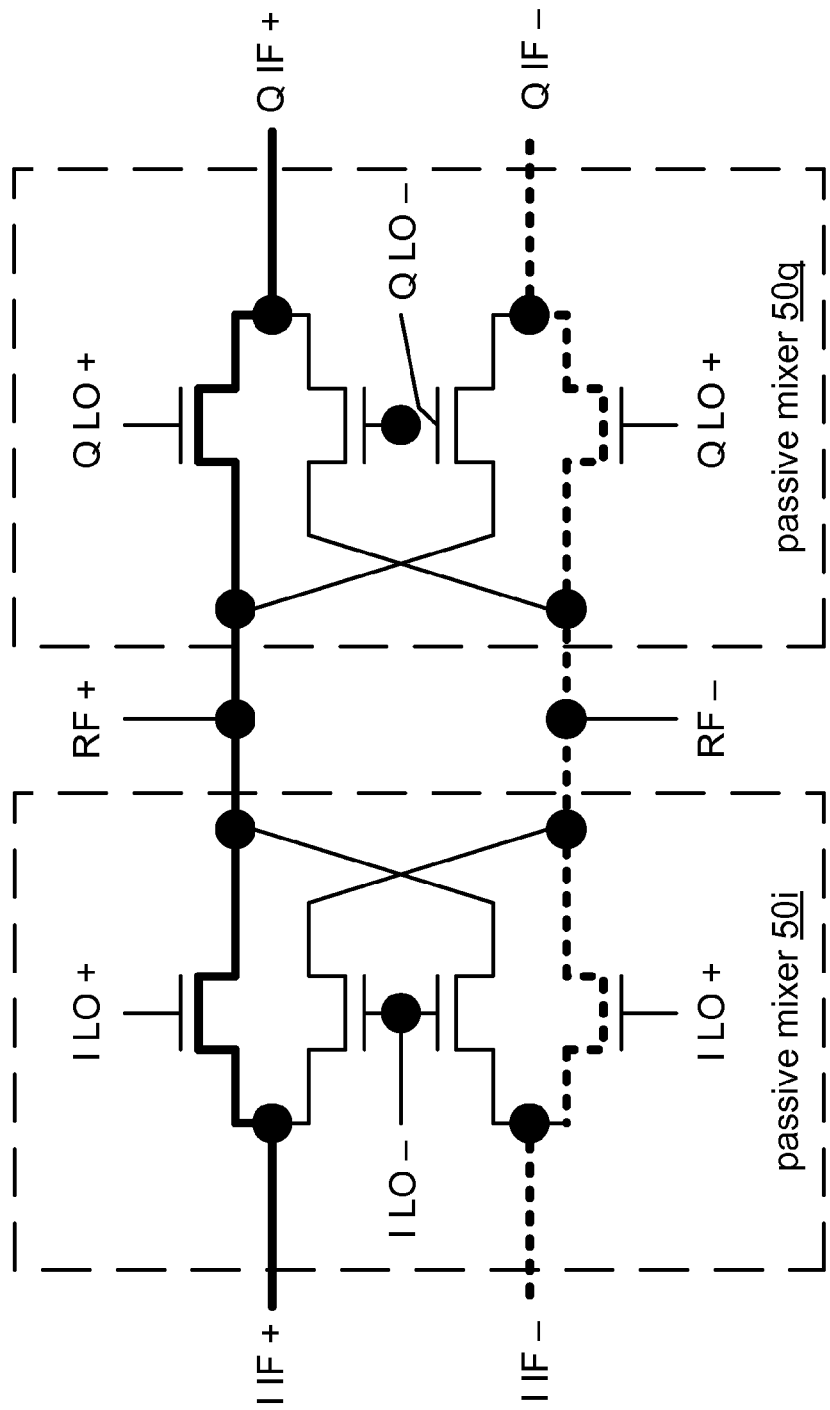
FIG. 13 shows an example of a cross-channel circuit path resulting from the overlap shown in period B of FIG. 11.
Figure 14:
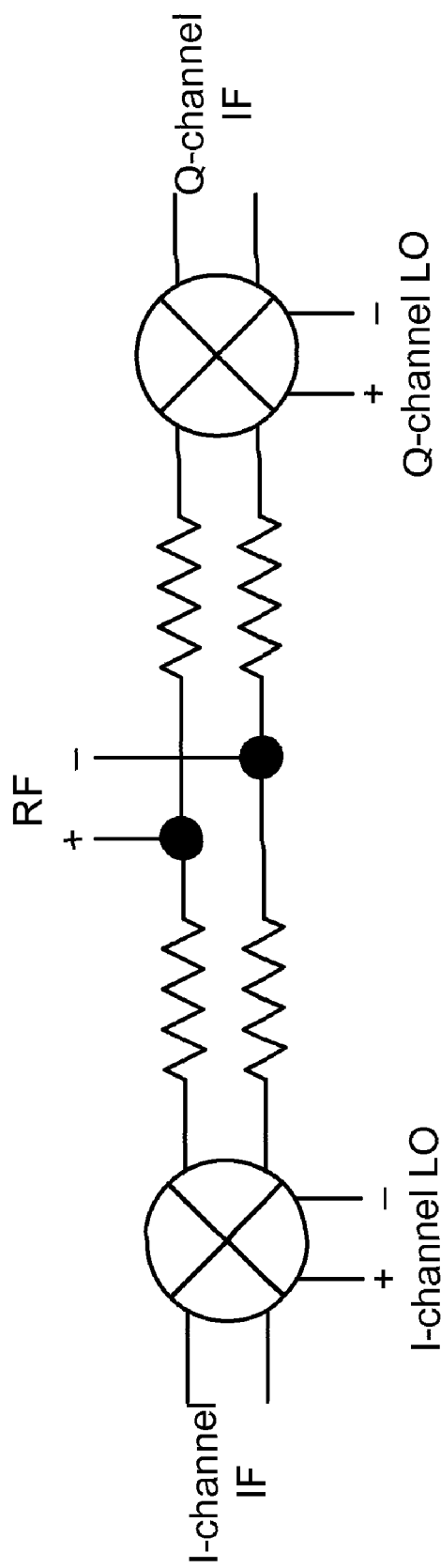
FIG. 14 shows an example of resistive isolation between I and Q mixers.

Because of the low impedance of the switches in the passive mixers, having switches on both sides open at the same time creates paths between the output terminals of the I mixer and the output terminals of the Q mixer. The bold lines in FIG. 12 show an example of the paths between the I and Q mixer outputs that correspond to overlap period A shown in FIG. 11, and the bold lines in FIG. 13 show an example of the paths between the I and Q mixer outputs that correspond to overlap period B shown in FIG. 11. When the mixers are arranged to drive a low-impedance input (such as the virtual ground of an opamp), one effect of these paths is that each mixer presents a low-impedance output.

The noise current generated by an opamp is inversely proportional to the output impedance of the preceding stage as presented at the opamp input. Consequently, the low output impedance of the passive mixer switch channels in the architecture of FIG. 8 may lead to a higher noise contribution from the opamp stage. A low impedance between the I and Q channels may also lead to upper sideband and lower sideband transfer functions that are asymmetrical near the band edge. In a quadrature mixer architecture that includes passive mixers, it may be desirable to isolate the I and Q mixer inputs from each other. Such isolation may help to reduce noise at the outputs of amplifier stages following the mixers and/or to maintain flatness of gain across the bandwidth.

One approach to avoiding the effects of cross-coupling between I and Q passive mixers is to use a splitter to split each side of the differential RF input into two separate paths. While this approach may effectively isolate the mixers from each other, it is likely that a suitable splitter will be an off-chip component, thus increasing manufacturing cost and circuit footprint, while the splitter's insertion loss will further increase the overall conversion loss. As shown in FIG. 13, another approach is to resistively isolate the input terminals of each mixer from the RF input. While such isolation may reduce leakage and cross-coupling of the I and Q mixers, this approach is also less than optimal. Besides the large voltage drop, which reduces voltage headroom and may increase conversion loss, the resistors will also contribute thermal noise.

In a current-commutating quadrature mixer architecture, adding a splitter or other isolation stage between the mixers may reduce the RF current available to each mixer and thus reduce conversion gain. Another factor that may reduce conversion gain in a current-commutating quadrature mixer architecture, even in the absence of an isolation stage, is overlapping on-periods of the I and Q mixers (as illustrated in FIG. 11, for example). Regardless of whether the architecture includes active mixers or passive mixers, such a switch overlap allows the RF current to be split between the two mixers. As shown in FIG. 11, switch overlap of the I and Q channels may occur constantly in a quadrature switching mixer architecture that uses local oscillator signals having duty cycles of 50%.

In a method according to an embodiment, mixing is performed using LO signals having a duty cycle of less than 50%. Although the switches in each mixer have a shorter on-period when such LO signals are used, more of the RF current is switched to the mixer during that time, yielding an overall theoretical increase in conversion gain. With respect to noise arising downstream of the mixer (which generally dominates at frequencies near baseband), this increase may result in a higher signal-to-noise ratio (SNR). By reducing or eliminating overlapping on-periods of passive mixers in the I and Q channels, such operation may also reduce opamp noise and may reduce or eliminate a need for an isolation stage between the channels. When LO signals having a duty cycle of 25% or less are used, for example, only one mixer is on at a time.

Figure 15:
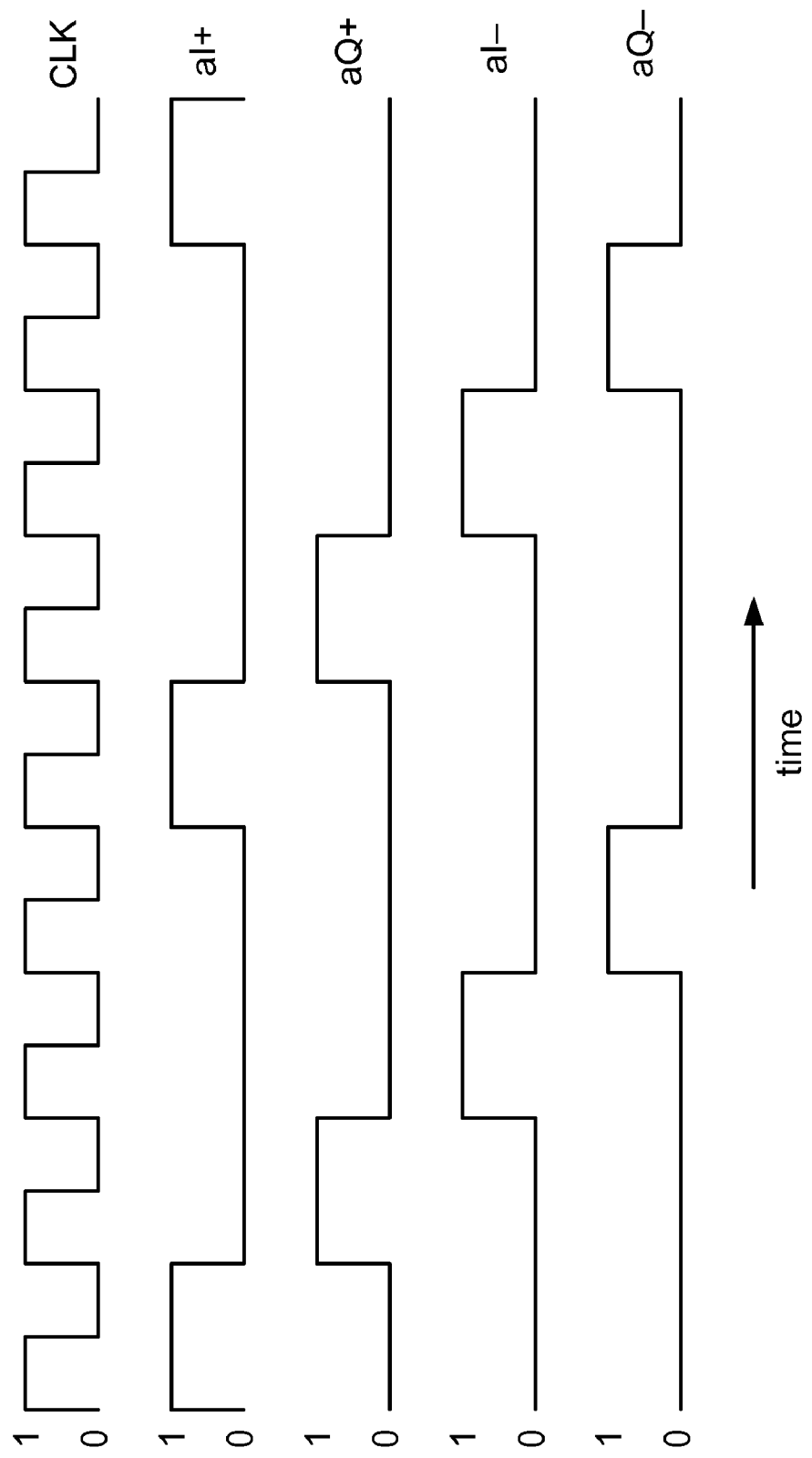
FIG. 15 shows an example of a set of local oscillator signals according to an embodiment.

FIG. 15 shows one example of a quadrature set of local oscillator signals that have duty cycles of 25%. As in the set of LO signals shown in FIG. 8, the I+ and Q+ signals are 90 degrees out of phase, and each one has a complement (I−, Q−) that is 180 degrees out of phase. In this example, each of the four LO signals has an amplitude that alternates between 0 and 1 at the local oscillator frequency and according to the phase of the particular signal.

Figure 16:
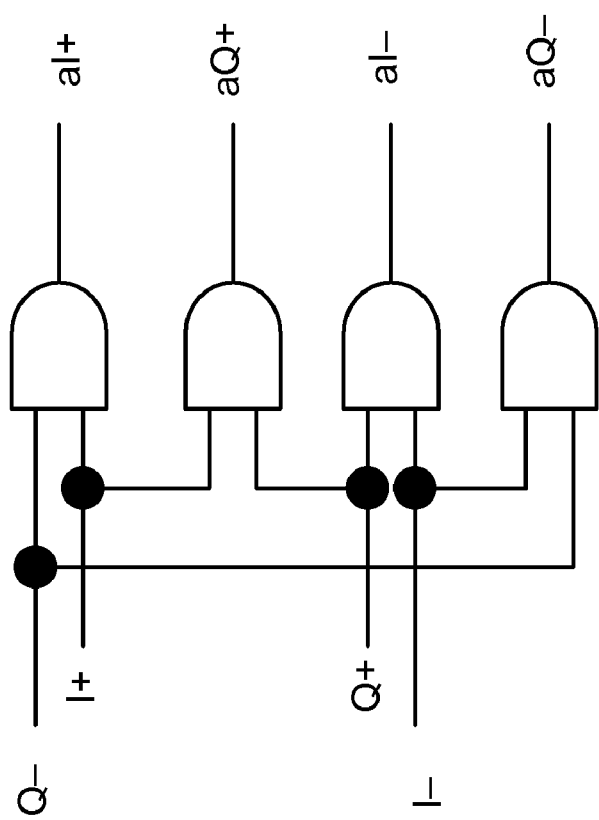
FIG. 16 shows a block diagram of a logic circuit that may be used to convert the set of LO signals shown in FIG. 8 into the set of LO signals shown in FIG. 15.

FIG. 16 shows one example of a logic circuit including four AND gates that may be used to generate a set of LO signals having a 25% duty cycle from a set of LO signals having a 50% duty cycle. An LO signal generator as shown in FIG. 8 or 9 may be modified to include such a circuit or its equivalent. In another implementation, an LO signal generator as shown in FIG. 8 or 9 is modified to produce directly a set of LO signals having a 25% duty cycle.

A comparison of the theoretical conversion gains that may be expected from (A) a mixer architecture using a complementary pair of square-wave LO signals having a duty cycle of 50% and (B) the theoretical conversion gain that may be expected from a mixer architecture using a complementary pair of square-wave LO signals having a duty cycle of 25% may be calculated according to the following expression of a mixing operation:

$$\cos(\omega_{F0}t)\cos(\omega_{LO}t) = \frac{1}{2}(\cos[(\omega_{F0}+\omega_{LO})t] + \cos[(\omega_{F0}-\omega_{LO})t]),$$

where $\omega_{F0}$ is the frequency of the input signal and $\omega_{LO}$ is the frequency of the fundamental component of each LO signal. Using the symbols $\alpha$ and $\beta$ to denote respective weights for the input and LO frequencies, and the subscripts 1 and 2 to denote mixing operations using LO signals having duty cycles of 50% and 25%, respectively, we can express the ratio between these theoretical conversion gains as:

$$\frac{\alpha_2\cos(\omega_{F0}t)\beta_2(\cos\omega_{LO}t)}{\alpha_1\cos(\omega_{F0}t)\beta_1(\cos\omega_{LO}t)} = \frac{\alpha_2}{\alpha_1} \times \frac{\beta_2}{\beta_1}.$$

First, we consider the ratio of the weights a for the input signals. When LO signals having a duty cycle of 50% are used to drive a quadrature pair of switching mixers, at any moment a switch is on in both of the I and Q mixers. When LO signals having a duty cycle of 50% are used to drive a quadrature pair of differential mixers as shown in FIGS. 2 or 3, for example, at any moment a pair of switches is on in each of the I and Q mixers. FIG. 11 illustrates an example of such overlapping switch activations. This overlap causes the RF current to be split between the mixers, such that at any moment when a mixer switch or switch pair is on, that mixer receives only half of the RF input current. When LO signals having a duty cycle of 25% are used, however, at any moment when a mixer switch or switch pair is on, the mixer receives all of the RF input current. Thus the ratio $\alpha_2/\alpha_1$ is equal to two.

A relation between the weights $\beta$ for the LO signals may be determined by considering the LO signals in the frequency domain. The Fourier transform of a periodic train of rectangular pulses may be expressed using the following series:

$$f(t) = AD + \sum_{i=1}^{\infty} \frac{2A}{i\pi}\sin(i\pi D)\cos\left(2i\pi\frac{t}{T}\right),$$

where A is a gain constant and D is the duty cycle of each pulse. In this expression, the first term represents a DC offset and the terms of the summation represent the fundamental (for i=1) and harmonics (for i>1). For a duty cycle D equal to 0.5, the terms of the summation for all even i are equal to zero, so that the LO signal contains no even-order harmonics. For values of D that are not equal to 0.5, at least some of the summation terms that correspond to even-order harmonics are nonzero.

From the series above, we can express the fundamental frequency component as:

$$f_1(t) = \frac{2A}{\pi}\sin(\pi D)\cos\left(2\pi\frac{t}{T}\right) = \frac{2A}{\pi}\sin(\pi D)\cos(\omega_{LO}t).$$

For a duty cycle D of 50%, the factor $\sin(\pi D)$ is equal to one. For a duty cycle D of 25%, the factor $\sin(\pi D)$ is equal to $\sqrt{2}/2$.

As the other factors of $f_1(t)$ are independent of the duty cycle, the ratio $\beta_2/\beta_1$ between the weights of the fundamental frequency component of the LO signals is equal to $\sqrt{2}/2$.

We can evaluate the ratio between the theoretical conversion gains by substituting the values for these two weight ratios into the expression above:

$$\frac{\alpha_2}{\alpha_1} \times \frac{\beta_2}{\beta_1} = 2 \times \frac{\sqrt{2}}{2} = \sqrt{2}.$$

This ratio applies individually to each of the I and Q channels. Because each of the I and Q channels thus achieves a theoretical gain of $\sqrt{2}$ when a set of LO signals having a duty cycle of 25% is used (as compared to when a set of LO signals having a duty cycle of 50% is used), the overall theoretical signal gain is 3 dB.

When an LO duty cycle of 25% is used instead of 50%, a gain of 3 dB in SNR may be expected with respect to noise that arises downstream of the mixers (e.g., in the opamps). For example, a gain of 3 dB in SNR may be expected at the output of an amplification stage following a mixer (e.g., an amplifier 20). Although this gain may not apply to noise which appears in the signal as received by the mixers (e.g., noise from a LNA), in some applications the dominant noise source occurs after the mixing stage. For a frequency converter based on passive mixers, for example, flicker noise comes mostly from opamps that follow the mixers.

Figure 17:
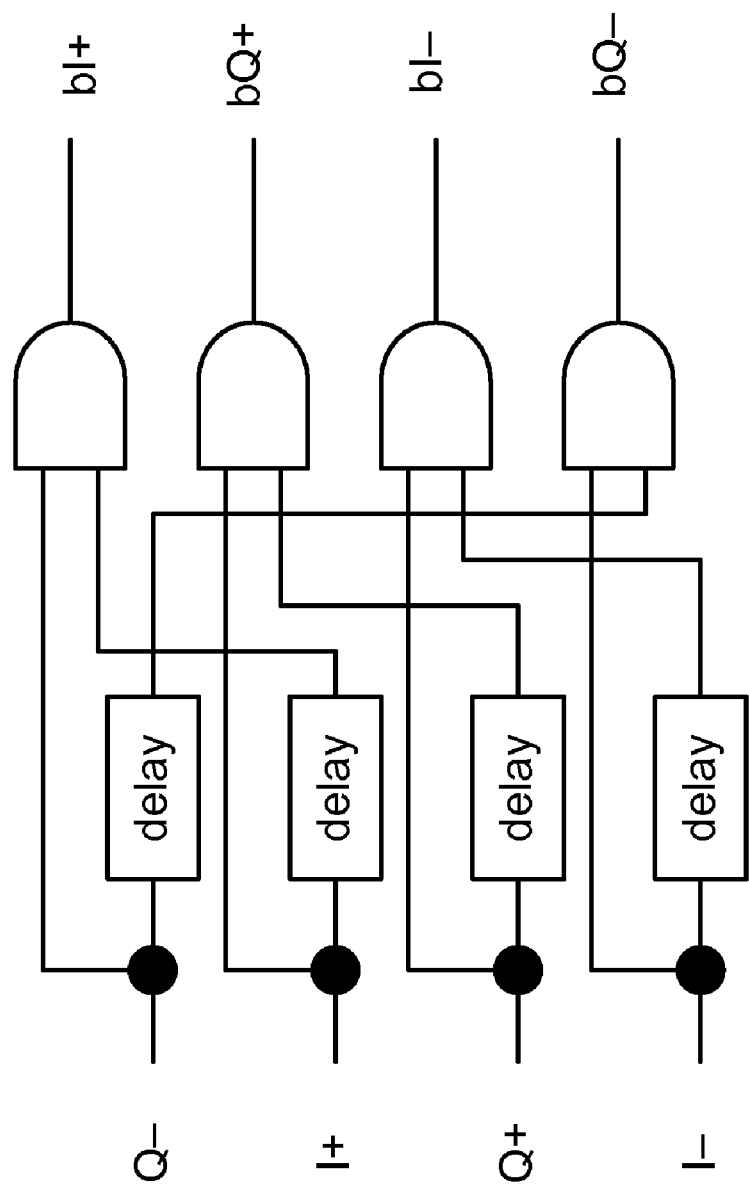
FIG. 17 shows a block diagram of a logic circuit that may be used to convert the set of LO signals shown in FIG. 8 into a set of LO signals having duty cycles of less than 25%.

When a set of quadrature LO signals is generated to have duty cycles of 25%, it is likely that the signals as applied at the mixers will have duty cycles greater than 25% due to distortions such as waveform rounding, which may be caused by effects such as parasitic capacitance. It may be appreciated from FIG. 15 that if the duty cycle exceeds 25%, switch on-time overlap between the I and Q channels may occur. Such overlap may result in RF current splitting and/or higher opamp noise as discussed above. In a further embodiment, the LO signals are generated to have duty cycles of less than 25%. In one such example, the LO signals are generated to have duty cycles that are substantially less than 25% (in the context of the duty cycles of the LO signals, "substantially less than" means "less than by 10% or more"). For example, the LO signal generator may be configured to generate a set of LO signals having duty cycles of 20% or even 15%. FIG. 17 shows one example of a logic circuit having four AND gates and four delay elements that may be used to convert the set of LO signals shown in FIG. 8 into a set of LO signals having duty cycles of less than 25%. In this case, a desired duty cycle for each output signal bI+/−, bQ+/− may be configured by selecting an appropriate delay value for each delay element. An LO signal generator as shown in FIG. 8 or 9 may be modified to include such a circuit or its equivalent. In another implementation, an LO signal generator as shown in FIG. 8 or 9 is modified to produce directly a set of LO signals having a 25% duty cycle. As the magnitude of the fundamental frequency component decreases as the duty cycle becomes smaller, it may be desirable to determine a duty cycle value for the particular application that may be expected to avoid switch overlap while retaining a duty cycle value close to 25%.

Harmonics in the LO signals may give rise to unwanted components in the mixer output signal. An LO signal having a duty cycle close to 25%, for example, has a strong second-order harmonic that may give rise to components at frequencies $\omega_{F0} \pm 2\omega_{LO}$. In some cases, it may be desired to filter the mixer output or otherwise to select one from among two or more principal frequency components of the mixed signal. As noted above, for example, a small capacitor may be included across the output terminals of each mixer to suppress high frequencies.

The foregoing presentation of the described embodiments is provided to enable any person skilled in the art to make or use the present invention. Various modifications to these embodiments are possible, and the generic principles presented herein may be applied to other embodiments as well. For example, an embodiment may be implemented in part or in whole as a hard-wired circuit, as a circuit configuration fabricated into an application-specific integrated circuit, or as a firmware program loaded into non-volatile storage or a software program loaded from or into a data storage medium (such as semiconductor or other volatile or nonvolatile memory, or magnetic and/or optical media such as a disk) as machine-readable code, such code being instructions executable by an array of logic elements such as a microprocessor or other digital signal processing unit or finite state machine.

Embodiments also include methods of frequency conversion as set forth in the appended claims and as expressly disclosed herein by descriptions of the operations of structural embodiments. Each of these methods may be tangibly embodied in one or more data storage media as machine-readable code.

Examples of wireless communications applications that use frequency conversion include portable devices for wireless communications, such as cellular telephones, personal digital assistants (PDAs), pagers, portable e-mail devices (such as the Blackberry™), and satellite devices for consumer and other uses (e.g., GPS receivers, subscription music receivers, television receivers). Other examples of devices for wireless communications include devices configured to communicate over wireless local-area and/or personal-area networks, such as a device compliant with a version of one or more specifications such as IEEE standard 802.11a, 802.11b, and/or 802.11n; IEEE standard 802.15.4 (also called Zig-Bee™); and IEEE standard 802.15.1 (Bluetooth™); and/or an ultra-wideband (UWB) device. Embodiments include methods and structures as disclosed herein that are configured for use with any such examples.

An implementation of a frequency converter as described herein may be embodied in a chip, possibly as part of a larger circuit that may include an input stage (e.g., a transconductance stage including transistors T1, T2), an output stage (e.g., transimpedance amplifiers such as opamps 20$i,q$), and/or a quadrature local oscillator signal generator. Such a chip may also include other circuitry for signal reception and/or transmission, such as a low-noise amplifier, a power amplifier, a modulator, a demodulator, and/or a digital signal processor. Embodiments also include specifications in a hardware description language (such as a variety of Verilog or VHDL) of structures disclosed herein, and consumer electronic devices (e.g. cellular telephones) including one or more such structures. Thus, the present invention is not intended to be limited to the embodiments shown above but rather is to be accorded the widest scope consistent with the principles and novel features disclosed in any fashion herein.

What is claimed is:

1. An apparatus including a frequency converter, said frequency converter comprising:
   a signal generator configured to generate a first complementary pair of local oscillator (LO) signals and a second complementary pair of LO signals such that a phase difference between a signal of the first complementary pair and a signal of the second complementary pair is substantially equal to ninety degrees;

a first mixer configured and arranged to mix a radio-frequency (RF) current signal with the first complementary pair of LO signals;

a second mixer configured and arranged to mix the RF current signal with the second complementary pair of LO signals, wherein said signal generator is configured to generate each signal of the first and second complementary pairs to have a duty cycle of substantially less than fifty percent, wherein each of said first and second mixers includes a passive mixer driving a low-impedance load;

a first feedback transimpedance amplifier arranged to receive, from said first mixer, a frequency-converted signal based on the RF current signal and the first complementary pair of LO signals; and a second feedback transimpedance amplifier arranged to receive, from said second mixer, a frequency-converted signal based on the RF current signal and the second complementary pair of LO signals.

2. The apparatus according to claim 1, wherein said signal generator is configured to generate each signal of the first and second complementary pairs to have a duty cycle substantially equal to twenty-five percent.

3. The apparatus according to claim 1, wherein said signal generator is configured to generate each signal of the first and second complementary pairs to have a duty cycle of substantially less than twenty-five percent.

4. The apparatus according to claim 3, wherein said apparatus is an integrated circuit.

5. The apparatus according to claim 3, wherein said apparatus is a device for wireless communications including said frequency converter.

6. The apparatus according to claim 3, wherein said apparatus comprises a cellular telephone including said frequency converter.

7. The apparatus according to claim 1, wherein said first mixer is configured and arranged to mix a differential RF current signal with the first complementary pair of LO signals, and wherein said second mixer is configured and arranged to mix the differential RF current signal with the second complementary pair of LO signals.

8. The apparatus according to claim 1, said frequency converter comprising a transconductance stage configured and arranged to output the RF current signal based on an RF voltage signal.

9. The apparatus according to claim 1, wherein said first mixer is configured to commutate the RF current signal according to the first complementary pair of LO signals, and wherein said second mixer is configured to commutate the RF current signal according to the second complementary pair of LO signals.

10. The apparatus according to claim 1, wherein said first mixer is configured to mix the RF current signal with the first complementary pair of LO signals to produce a baseband signal based on an in-phase component of the RF current signal, and wherein said second mixer is configured to mix the RF current signal with the second complementary pair of LO signals to produce a baseband signal based on a quadrature component of the RF current signal.

11. The apparatus according to claim 1, wherein at least one among said first and second transimpedance amplifiers includes an operational amplifier.

12. A computer-readable medium encoded with a machine-executable specification, in a hardware description language, wherein execution of the machine-executable specification is for emulating a frequency converter comprising:

a signal generator configured to generate a first complementary pair of local oscillator (LO) signals and a second complementary pair of LO signals such that a phase difference between a signal of the first complementary pair and a signal of the second complementary pair is substantially equal to ninety degrees;

a first mixer configured and arranged to mix a radio-frequency (RF) current signal with the first complementary pair of LO signals;

a second mixer configured and arranged to mix the RF current signal with the second complementary pair of LO signals, wherein each of said first and second mixers includes a passive mixer driving a low-impedance load and wherein said signal generator is configured to generate each signal of the first and second complementary pairs to have a duty cycle of substantially less than fifty percent;

a first feedback transimpedance amplifier arranged to receive, from said first mixer, a frequency-converted signal based on the RF current signal and the first complementary pair of LO signals; and a second feedback transimpedance amplifier arranged to receive, from said second mixer, a frequency-converted signal based on the RF current signal and the second complementary pair of LO signals.

13. A method of frequency conversion, said method comprising:

generating a first complementary pair of local oscillator (LO) signals and a second complementary pair of LO signals such that a phase difference between a signal of the first complementary pair and a signal of the second complementary pair is substantially equal to ninety degrees;

in a first channel, mixing a radio-frequency (RF) current signal with the first complementary pair of LO signals using a passive mixer driving a low-impedance load;

in a second channel, mixing the RF current signal with the second complementary pair of LO signals using a passive mixer driving a low impedance load, wherein each signal of the first and second complementary pairs has a duty cycle of substantially less than fifty percent;

generating a first RF voltage signal proportional to a first frequency-converted signal current using a first feedback transimpedance amplifier, wherein the first frequency converted signal is received in the first channel and is based on the RF current signal and the first complementary pair; and generating a second RF voltage signal proportional to a second frequency-converted signal current using a second feedback transimpedance amplifier, wherein the second frequency converted signal is received in the second channel and is based on the RF current signal and the second complementary pair.

14. The method of frequency conversion according to claim 13, said method comprising generating each of the signals of the first and second complementary pairs of LO signals to have a duty cycle substantially equal to twenty-five percent.

15. The method of frequency conversion according to claim 13, said method comprising generating each of the signals of the first and second complementary pairs of LO signals to have a duty cycle of less than twenty-five percent.

16. The method of frequency conversion according to claim 13, said method comprising generating each of the signals of the first and second complementary pairs of LO signals to have a duty cycle of substantially less than twenty-five percent.

17. The method of frequency conversion according to claim 13, wherein said mixing in a first channel comprises mixing a differential RF current signal with the first complementary pair of LO signals, and wherein said mixing in a second channel comprises mixing the differential RF current signal with the second complementary pair of LO signals.

18. The method of frequency conversion according to claim 13, said method comprising converting an RF voltage signal to the RF current signal.

19. The method of frequency conversion according to claim 13, wherein said mixing in a first channel comprises commutating the RF current signal according to the first complementary pair of LO signals, and wherein said mixing in a first channel comprises commutating the RF current signal according to the second complementary pair of LO signals.

20. The method of frequency conversion according to claim 13, wherein said mixing in a first channel comprises mixing the RF current signal with the first complementary pair to produce a first baseband signal based on an in-phase component of the RF signal, and wherein said mixing in a second channel comprises mixing the RF current signal with the second complementary pair to produce a second baseband signal based on a quadrature component of the RF signal.

21. An apparatus including a frequency converter, said frequency converter comprising:
  means for generating a first complementary pair of local oscillator (LO) signals and a second complementary pair of LO signals such that a phase difference between a signal of the first complementary pair and a signal of the second complementary pair is substantially equal to ninety degrees;
  in a first channel, means for passively mixing a radio-frequency (RF) current signal with the first complementary pair of LO signals driving a low-impedance load;
  in a second channel, means for passively mixing the RF current signal with the second complementary pair of LO signals driving a low-impedance load, wherein said means for generating is configured to generate each signal of the first and second complementary pairs to have a duty cycle of substantially less than fifty percent;
  a first feedback transimpedance amplifier arranged to receive, from said first means for passively mixing, a frequency-converted signal based on the RF current signal and the first complementary pair of LO signals; and
  a second feedback transimpedance amplifier arranged to receive, from said second means for passively mixing, a frequency-converted signal based on the RF current signal and the second complementary pair of LO signals.

22. The apparatus according to claim 21, wherein said means for generating is configured to generate each signal of the first and second complementary pairs to have a duty cycle substantially equal to twenty-five percent.

23. The apparatus according to claim 21, wherein said means for generating is configured to generate each signal of the first and second complementary pairs to have a duty cycle of substantially less than twenty-five percent.

24. The apparatus according to claim 23, wherein said apparatus is an integrated circuit.

25. The apparatus according to claim 23, wherein said apparatus comprises a device for wireless communications including said frequency converter.

26. The apparatus according to claim 23, wherein said apparatus comprises a cellular telephone including said frequency converter.

27. The apparatus according to claim 21, said frequency converter comprising a means for converting an RF voltage signal to the RF current signal.

28. The apparatus according to claim 21, wherein said means for mixing in a first channel is configured to commutate the RF current signal according to the first complementary pair of LO signals, and wherein said means for mixing in a second channel is configured to commutate the RF current signal according to the second complementary pair of LO signals.

29. The apparatus according to claim 21, wherein said means for mixing in a first channel is configured to mix the RF current signal with the first complementary pair of LO signals to produce a baseband signal based on an in-phase component of the RF current signal, and wherein said means for mixing in a second channel is configured to mix the RF current signal with the second complementary pair of LO signals to produce a baseband signal based on a quadrature component of the RF current signal.

* * * * *